(12) United States Patent
Lara Dominguez et al.

(10) Patent No.: US 11,688,432 B2
(45) Date of Patent: Jun. 27, 2023

(54) DISK DRIVE AND CARRIER ASSEMBLY

(71) Applicant: International Business Machines Corporation, Armonk, NY (US)

(72) Inventors: Jonathan Oswaldo Lara Dominguez, Guadalajara (MX); Victor Arturo Tapia Jimenez, Guadalajara (MX); Luis Cruz Mejia, Guadalajara (MX); Oscar Eduardo Flores Pantoja, Zapopan (MX); Jesus Ernesto Ibarra Hernandez, Zapopan (MX)

(73) Assignee: International Business Machines Corporation, Armonk, NY (US)

( * ) Notice: Subject to any disclaimer, the term of this patent is extended or adjusted under 35 U.S.C. 154(b) by 166 days.

(21) Appl. No.: 17/099,288

(22) Filed: Nov. 16, 2020

(65) Prior Publication Data

US 2022/0157349 A1    May 19, 2022

(51) Int. Cl.
*G11B 5/127* (2006.01)
*H04R 31/00* (2006.01)
*G11B 33/12* (2006.01)
*G06F 1/18* (2006.01)
*G11C 5/12* (2006.01)

(52) U.S. Cl.
CPC ............ *G11B 33/128* (2013.01); *G06F 1/187* (2013.01); *G11C 5/12* (2013.01); *Y10T 29/53165* (2015.01)

(58) Field of Classification Search
CPC ............ Y10T 29/53165; G11B 33/124; G11B 33/128; G06F 1/187; G11C 5/04; G11C 5/12
See application file for complete search history.

(56) References Cited

U.S. PATENT DOCUMENTS

| | | | |
|---|---|---|---|
| 5,566,383 A | 10/1996 | Gildea | |
| 6,088,221 A | 7/2000 | Bolognia | |
| 6,532,150 B2 | 3/2003 | Sivertsen | |
| 6,565,163 B2* | 5/2003 | Behl | G11B 33/148 |
| 8,023,263 B2* | 9/2011 | Crippen | G06F 1/187 |
| | | | 361/679.33 |
| 8,869,385 B2 | 10/2014 | Chang | |
| 8,971,036 B1 | 3/2015 | Lau | |
| 9,348,375 B1 | 5/2016 | Shen | |
| 10,455,724 B1 | 10/2019 | Zhang | |
| 10,535,376 B1 | 1/2020 | Bian | |
| 10,664,024 B2* | 5/2020 | Hung | H05K 7/1489 |
| 2011/0109990 A1 | 5/2011 | Fang | |
| 2012/0300389 A1 | 11/2012 | Chen | |
| 2016/0260462 A1* | 9/2016 | Szczesniak | G11B 33/022 |

\* cited by examiner

*Primary Examiner* — Paul D Kim
(74) *Attorney, Agent, or Firm* — Monchai Chuaychoo

(57) ABSTRACT

An approach for assembling a hard drive to a hard drive carrier is provided. The approach includes an ergonomic tool to aid with assembly. The ergonomic tool allows for a reduction in assembly time and prevents damage to the components. The ergonomic tool comprising of a base having a first surface and a first end open for receiving the components. The tool has a set of walls rising from the base, a first wall rising from the base proximate a second end opposite the first end and a pair of opposing side walls including voids rising from the first surface between the first end and the second end, to form a slot there between to receive the components within and adjacent the first surface. The tool has a releasable hold mechanism that aligns the components during assembly.

12 Claims, 10 Drawing Sheets

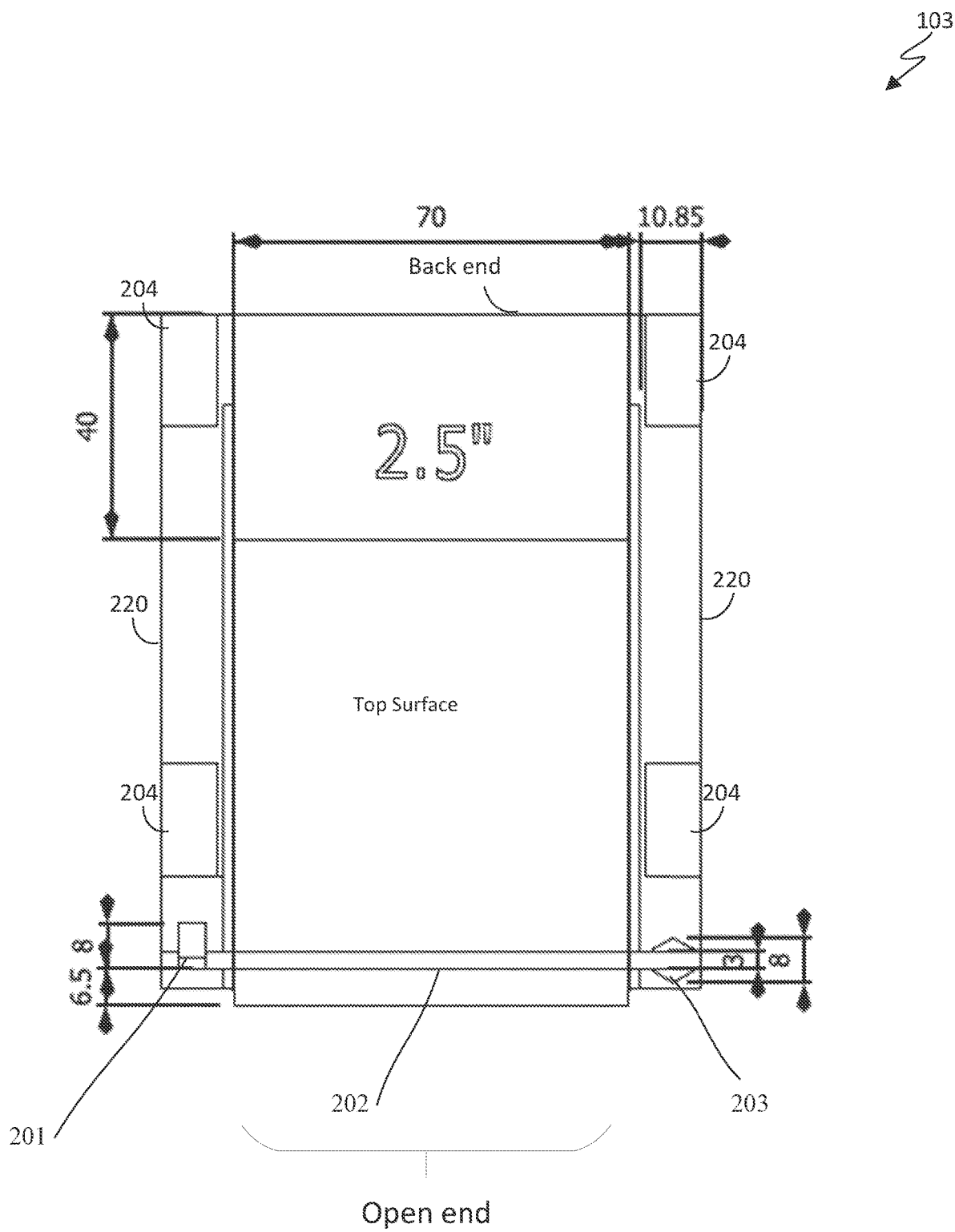
FIG. 3A    (Top View)

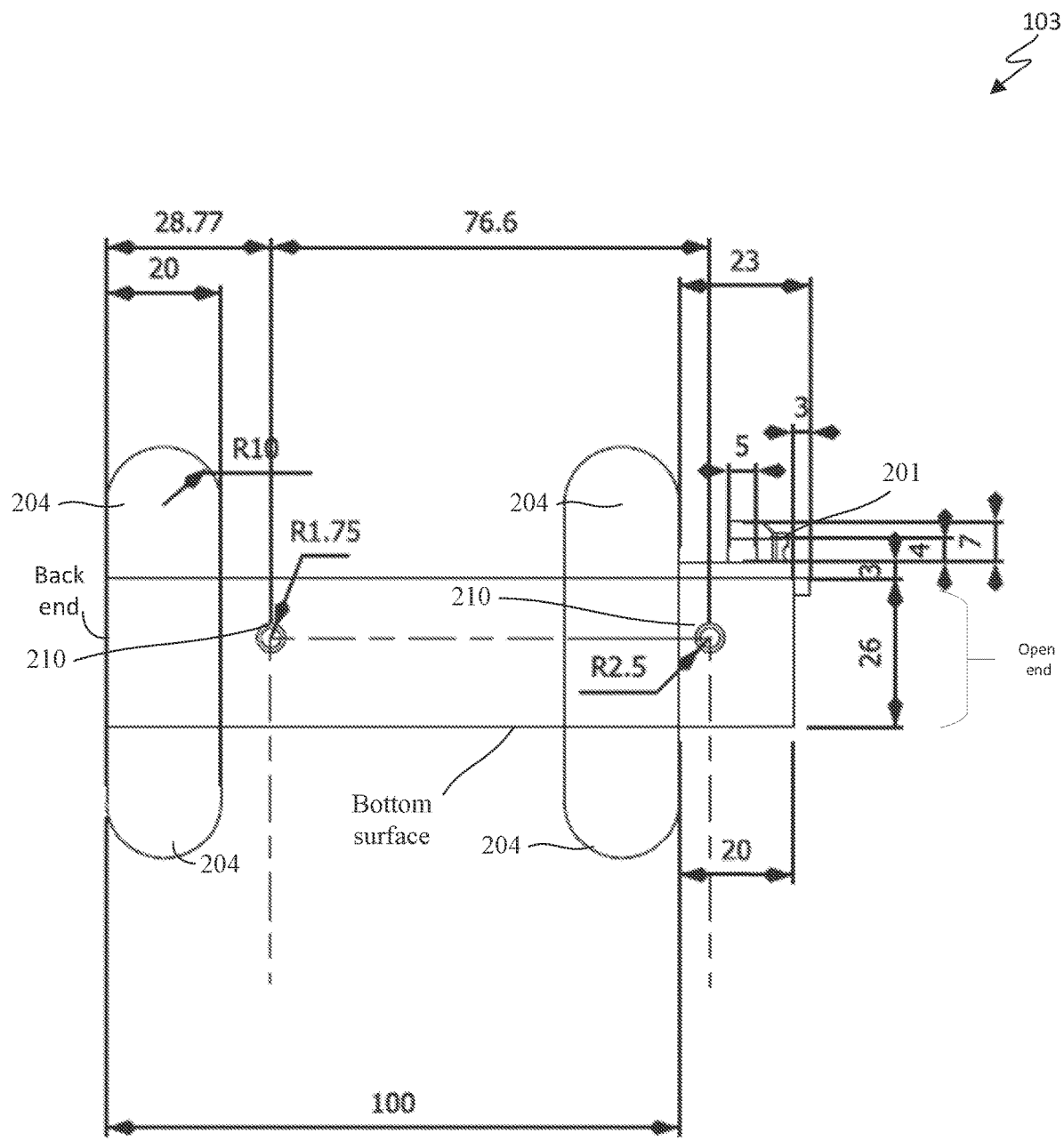
FIG. 3B (Side view)

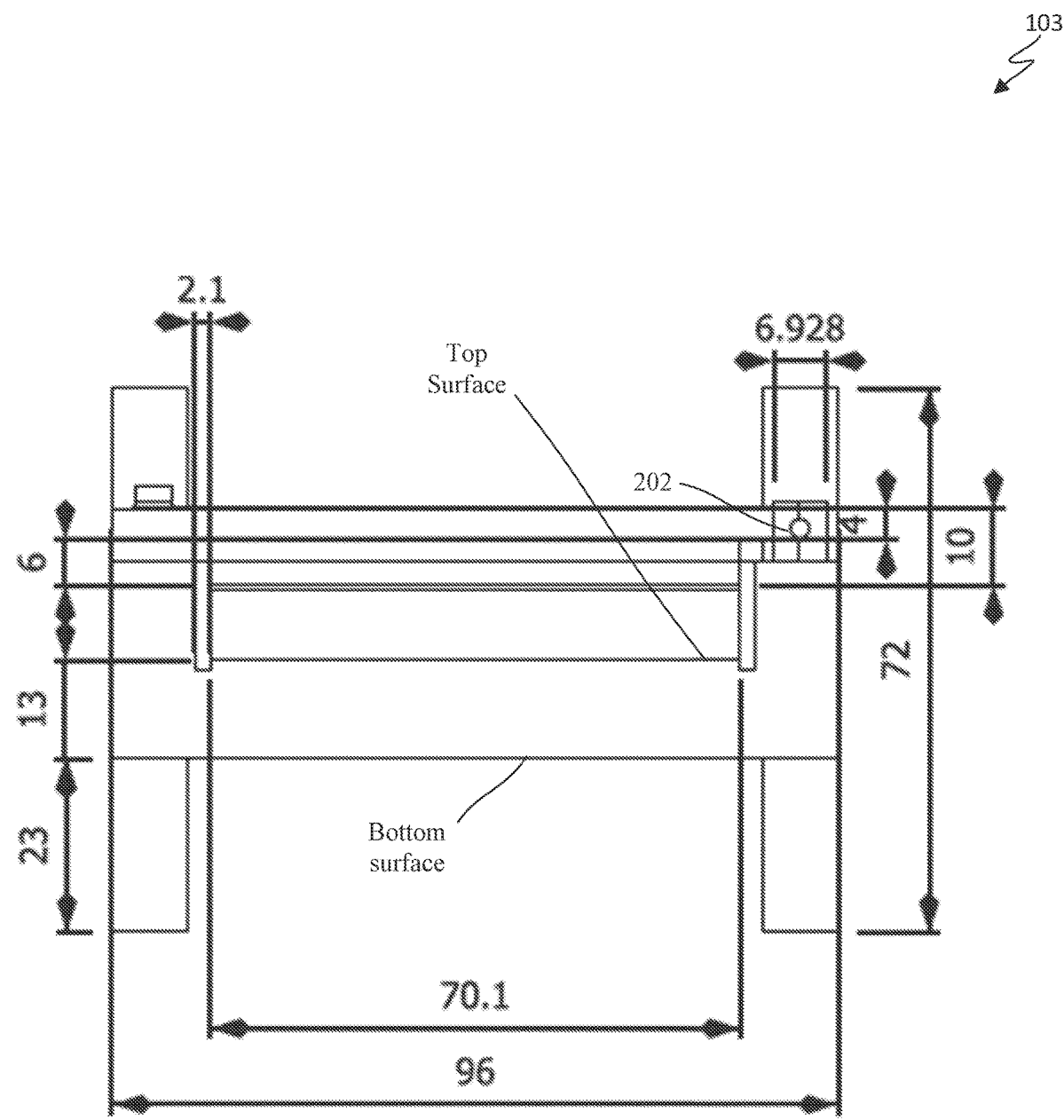
FIG. 3C  (Front View)

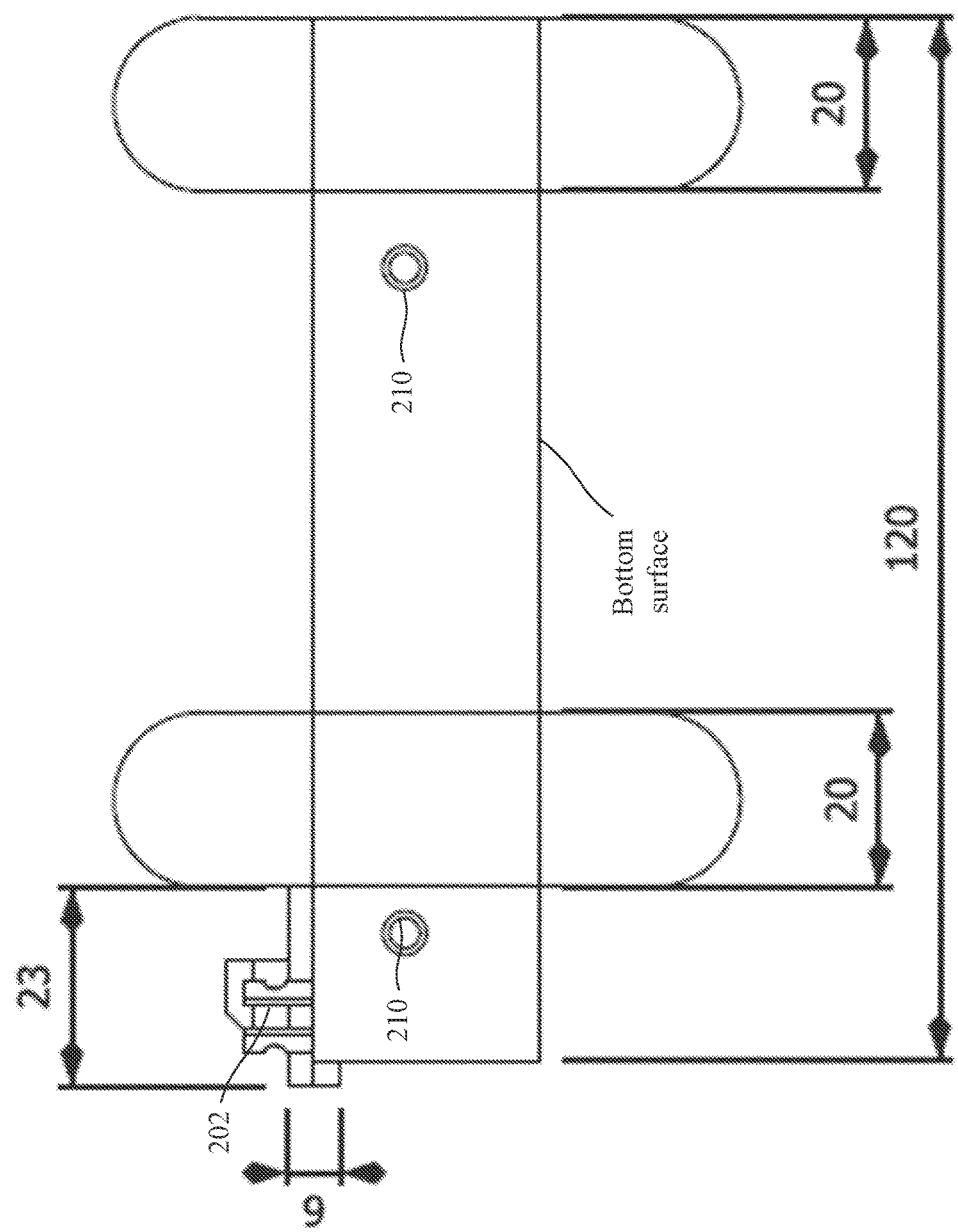
FIG. 3D (Side view)

DISK DRIVE AND CARRIER ASSEMBLY

BACKGROUND OF THE INVENTION

The present invention relates generally to the information handling systems and more particularly to assembling of hard drive components included in information handling systems.

An information handling system (e.g., data center, cloud, etc.) typically includes one or more hard drives that is coupled to the chassis of a computer or a drive bay. A hard drive is an electro-mechanical data storage device that stores and retrieves digital data. Data is stored using a magnetic recording process along with the use of one or more rotating platters coated with magnetic material. The platters are coupled with magnetic heads via a moving actuator arm. The magnetic heads can read and write data to the platter surfaces.

A hard drive carrier assembly can be used a way for the hard drive to be coupled to the computer and/or drive bay. The hard drive carrier allows a hard drive to mechanically mates with a drive bay in a computer chassis (e.g., rack mounted, etc.).

SUMMARY

According to another embodiment, a fixture for holding a hard drive to a carrier in place prior to assembly, wherein the fixture comprising: a base having a first surface; a first end open for receiving the hard drive and the hard drive carrier; and a set of walls rising from the base, a first wall rising from the base proximate a second end opposite the first end and a pair of opposing side walls including voids rising from the first surface between the first end and the second end, to form a slot there between to receive the components within and adjacent the first surface; and a releasable hold mechanism proximate the first end in a first position enabling the receiving of the hard drive and the hard drive carrier and in a second position providing a releasable hold of the components.

According to another embodiment, a system for assembly of a hard drive to a carrier by using a fixture, the system comprising; a hard drive; a hard drive carrier; a fixture, wherein the fixture comprising: a base having a first surface and a second surface; a first end open of the base for receiving components; a set of walls rising from the base, a first wall rising from the base proximate a second end opposite the first end and a pair of opposing side walls including voids rising from the first surface between the first end and the second end, to form a slot there between to receive the components within and adjacent the first surface; a first set of plurality of stands attached to the first wall near the first end and the second end, rising away from the first surface; a second set of plurality of stands attached to the first wall near the first end and the second end, rising away from the second surface; a third set of plurality of stands attached to the second wall near the first end and the second end, rising away from the first surface; a fourth set of plurality of stands attached to the second wall near the first end and the second end, rising away from the second surface; and a releasable hold mechanism proximate the first end in a first position enabling the receiving of the components and in a second position providing a hold of the components; one or more fasteners; and a fastening tool to apply the fasteners between the hard drive carrier to the hard drive through the voids, while the hard drive and the hard drive carrier is being held in place by the fixture.

According to an embodiment, a method for XYZ, the method comprising: itemizing components, wherein the components comprises of a hard drive and a hard drive carrier; aligning the components in a fixture, dimensioned to contain the components; locking the components in the fixture; assembling a first set of fasteners on the components; assembling a second set of fasteners on the components; labeling the assembled components; and releasing the assembled components.

BRIEF DESCRIPTION OF THE DRAWINGS

Preferred embodiments of the present invention will now be described, by way of example only, with reference to the following drawings, in which:

FIG. 3A illustrates a top profile view of tool 103, in accordance with one embodiment of the present invention;

FIG. 3B illustrates a left profile view of tool 103, in accordance with one embodiment of the present invention;

FIG. 3C illustrates a front profile view of tool 103, in accordance with one embodiment of the present invention;

FIG. 3D illustrates a right profile view of tool 103, in accordance with one embodiment of the present invention;

DETAILED DESCRIPTION

Figure 1:
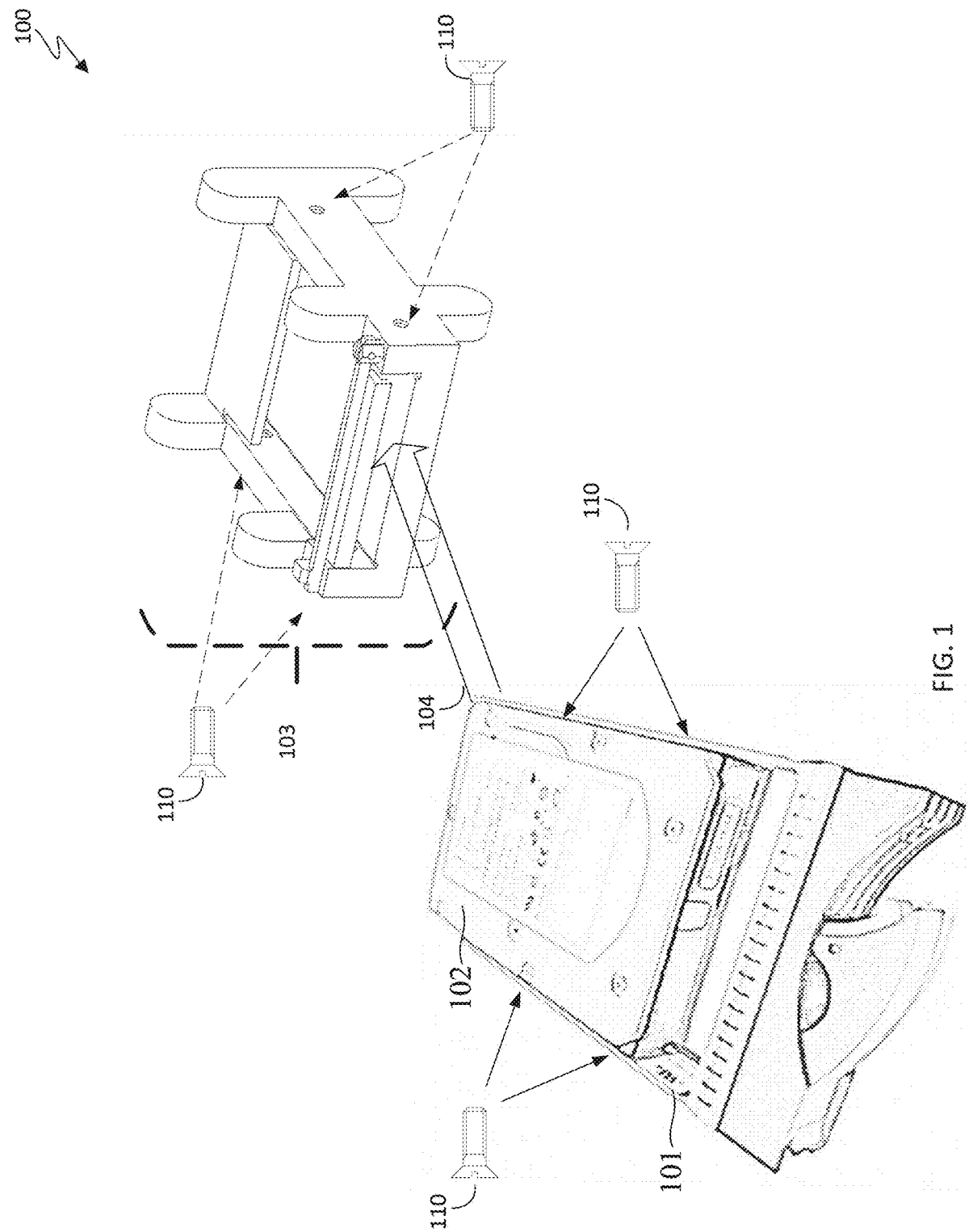
FIG. 1 illustrates a typical hard drive coupled to a hard drive carrier along with the invention, designated as hard drive environment 100, in accordance with an embodiment of the present invention.

The current state of art with manually assembling hard disk drive begins with placing a hard drive and the carrier from a container and fastening the screws of the carrier to the hard drive structure. This assembly process introduces deficiencies such as, potential damage during the aligning the carrier to the screw holes of the hard drive structure and possible repetitive strain injury to the writs and hands due to the poor ergonomics procedure.

Embodiments of the present invention recognize the deficiencies with the current process of assembling disk drive and address those deficiencies with an improved approach. The approach includes the use of a new ergonomic tool, which will prevent damage to materials and help operator to a better & faster handling. The ergonomic tool can assure the grip and alignment of the carrier/disk in a safety improving this procedure to become ergonomic, quick and safe. The tool act like a template to prevent miss assembly, improve the sequence on screwing and Hand free for other activities and better ergonomic assembly sequence.

Other embodiments of the present invention may recognize one or more of the following facts, potential problems, potential scenarios, and/or potential areas for improvement with respect to the current state of the art: i) makes assembly training is easier and faster, ii) not overly complex to use and it is cheaper than to implement other automatic methods as screwing dispenser, iii) helps to make more efficient the disk drive assembly In a safe manner (i.e., currently the operators handle both items to screw in the air), iv) improved accuracy since the tool have a base aligned to the screw hole, v) reduction in cycle time, vi) error is reduced along with less parts damage caused by wrong screwing.

It is noted that the approach and various embodiment of the present invention can be used for the any hard drive carriers in the industry. However, the embodiments and figures illustrated in this disclosure were made for an IBM® carrier and is implemented in 2.5 and 3.5 HDD configuration.

Embodiments of the present invention will now be described in detail with reference to the accompanying figures. It is to be understood that the disclosed embodiments are merely illustrative of potential embodiments of the present invention and may take various forms. In addition, each of the examples given in connection with the various embodiments is intended to be illustrative, and not restrictive. Further, the figures are not necessarily to scale, and elements and features can have different dimensions than those depicted in the figures. Therefore, specific structural and functional details disclosed herein are not to be interpreted as limiting, but merely as a representative basis for teaching one skilled in the art to variously employ the present invention.

References in the specification to "an exemplary embodiment," and "other embodiments," etc., indicate that the embodiment described may include a particular feature, structure or characteristic, but every embodiment may not necessarily include the particular feature, structure or characteristic. Further, when a particular feature, structure, or characteristic is described in connection with an embodiment, it is submitted that it is within the knowledge of one skilled in the art to affect such feature, structure or characteristic in connection with other embodiments whether or not specifically described.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

FIG. 1 illustrates a typical hard drive coupled to a hard drive carrier along with the invention, designated as hard drive environment 100, in accordance with an embodiment of the present invention. Hard drive environment contains hard drive carrier 101, hard drive 102, tool 103 an fasteners 110.

Hard drive carrier 101 represents a means for a hard drive (i.e., hard drive 102) to be coupled to the computer and/or drive bay. The hard drive carrier allows a hard drive to mechanically mates with a drive bay in a computer chassis (e.g., rack mounted, etc.).

Hard drive 102 is an electro-mechanical data storage device that stores and retrieves digital data. Hard drive 102 can vary in size, from 2.5-inch to 3.5-inch form factor.

Tool 103 of the present invention is an approach that allows the ease of assembling (via screws) a hard drive (i.e., hard drive 102) to a hard drive carrier (i.e., hard drive carrier 101). Essentially, hard drive 102 and hard drive carrier 101 can be inserted (via arrow 104) into tool 103. Tool 103 allows for a fixed and precise alignment of screw holes of the carrier and the hard drive. Once, both hard drive 102 and hard drive carrier 101 are seated and clamped down properly in tool 103, a user can easily insert screws into the screw holes of tool 103 and fasten the screws between hard drive and the carrier. Tool 103 will be explained in greater details according to FIGS. 2A, 2B, 2C, 2D and 4.

Fasteners 110 can be hardware devices that are used to mechanically join or affixes two or more objects together. For example, fasteners 110 (e.g., screws, etc.) can be used to join the hard carrier to the hard drive.

Figure 2A:
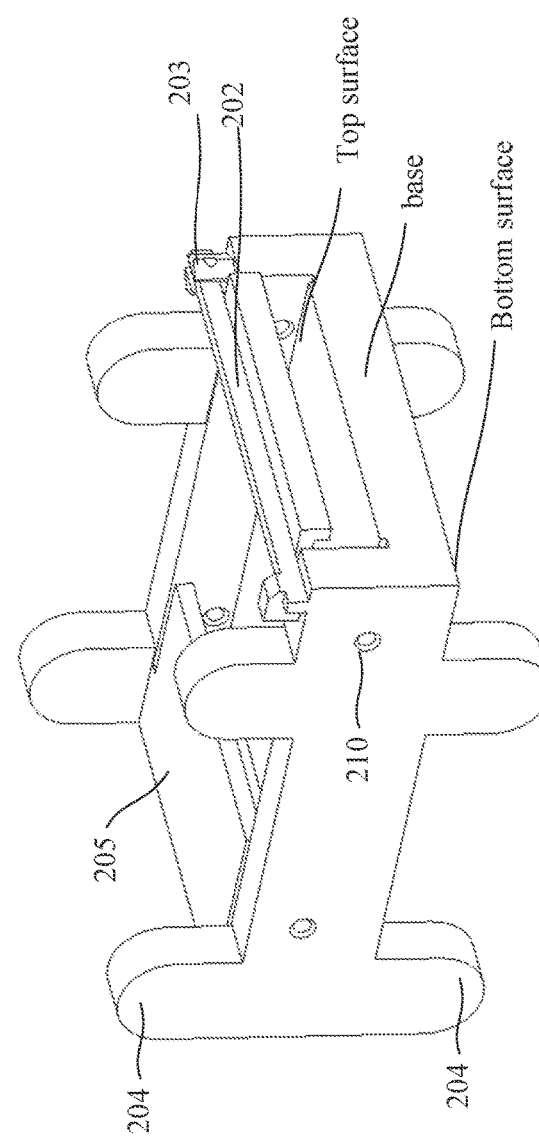
FIG. 2A illustrates a left front angled perspective view of the invention, designed to ease the process of assembling a hard drive carrier to a hard drive, designated as tool 103, in accordance with one embodiment of the present invention.
Figure 2B:
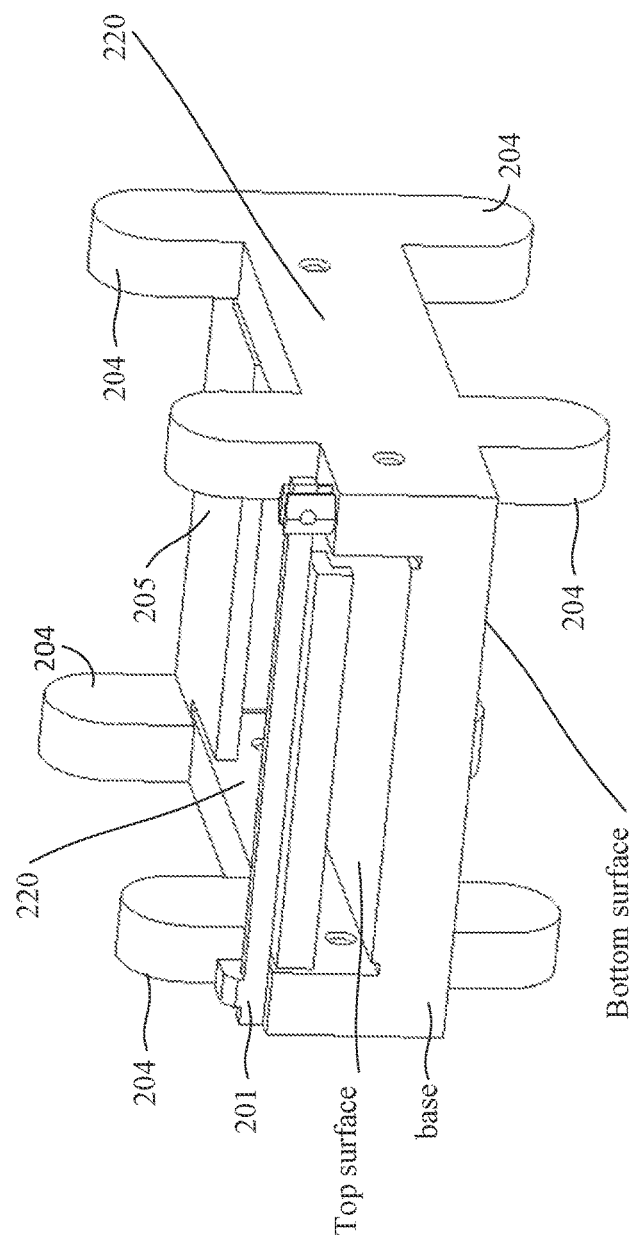
FIG. 2B illustrates a right front angled perspective view of the invention, designed to ease the process of assembling a hard drive carrier to a hard drive, designated as tool 103, in accordance with one embodiment of the present invention.

FIG. 2A illustrates a left front angled perspective view of the invention and FIG. 2B illustrates a right front angled perspective view of the invention, in accordance with one embodiment of the present invention. Tool 103 contains clamp bar latch 201, clamp bar 202, clamp pivot 203, legs 204, backend plate 205 and screw holes 210. In the current depicted embodiment, all components of tool 103 and including tool 103 can be made from aluminum. However, tool 103 can be made from other materials such as high density plastic, such as polyoxymethylene. As it can be seen from FIGS. 2A and 2B (and FIG. 1), tool 103 is shaped similar (i.e., rectangular box with legs) to accommodate a hard drive. There is a base (varying thickness based on need of user) which has a top surface and bottom surface. There are at least two side walls 220, which rises from the base (i.e., top surface) to match the height of a typical hard drive (to prevent the hard drive from sliding out laterally). A "left" side wall can be identified from side walls 220 based on the perspective of the user if the user is viewing the open end of tool 103 wherein the left wall can be designated as "left" side wall. This designation can be assigned to the right side wall as well. Finally, tool 103 has an opening end (for the hard drive to slide into) and a closed end (containing backend plate 205) to prevent the hard drive from sliding out/through (i.e., backend).

Clamp bar 202 is a mechanism for securing the front of the hard drive and hard drive carrier from sliding out from tool 103. Clamp bar is comprised of clamp bar latch 201 and clamp pivot 203. Clamp bar 202 and subcomponents (e.g., clamp pivot 203, clamp bar latch 201, etc.) will be further explained in greater details in FIG. 4.

Clamp bar latch 201 is a mechanism affixed to tool 103 that allows for locking the end of the non-pivot portion of the clamp bar 202.

Clamp pivot 203 allows for a hinge pin to be inserted through clamp bar 202, further allowing clamp bar 202 to rotate up (away) and down (back) to the front of tool 103.

Legs 204 allows tool 103 to be placed horizontal or vertical to a surface (i.e., table). Tool 103 can contain four legs 204. However, it is not necessary to have four legs, there can be more or less than four depending on the application. It is noted that legs 204 can protrude from the "left" and "right" side walls 220 (i.e., perpendicular to the top surface of the base) or legs 204 can protrude from the bottom surface of the base.

Backend plate 205 is a piece at the end of tool 103 that allows for the hard drive and hard drive carrier to stop from sliding through tool 103. Back end plate can function as means to stop the hard driving and hard drive carrier from falling out when tool 103 is tilted to a vertical position.

Screw holes 210 are holes aligned to hard drive and hard drive carrier that allows screws to be inserted and a user to quickly fasten the hard drive and hard drive carrier together with precision and accuracy.

FIG. 3A illustrates a top profile view of tool 103, in accordance with one embodiment of the present invention. The current illustration shows an example of tool 103 for use with a 2.5-inch drive with the dimensions in metric unit for tool 103 (including subcomponents).

FIG. 3B illustrates a left profile view of tool 103, an example for use with a 2.5-inch drive with dimensions in metric unit, in accordance with one embodiment of the present invention. The current illustration shows an example of tool 103 for use with a 2.5-inch drive with the dimensions in metric unit for tool 103 (including subcomponents).

FIG. 3C illustrates a front profile view of tool 103, an example for use with a 2.5-inch drive with dimensions in metric unit, in accordance with one embodiment of the present invention. The current illustration shows an example of tool 103 for use with a 2.5-inch drive with the dimensions in metric unit for tool 103 (including subcomponents).

FIG. 3A illustrates a right profile view of tool 103, an example for use with a 2.5-inch drive with dimensions in metric unit, in accordance with one embodiment of the present invention. The current illustration shows an example of tool 103 for use with a 2.5-inch drive with the dimensions in metric unit for tool 103 (including subcomponents).

Figure 4:
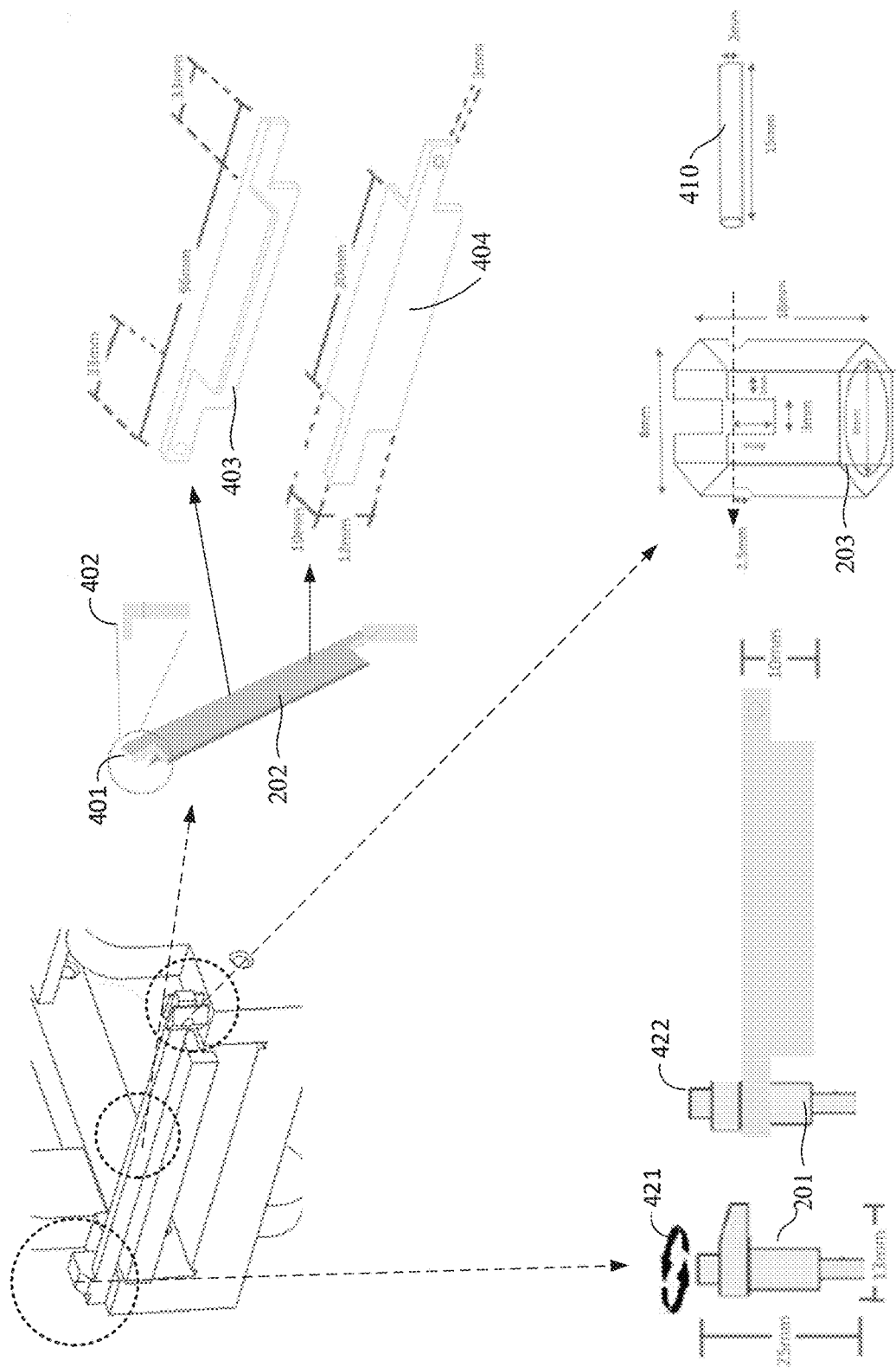
FIG. 4 illustrates components of a hard drive fastener of tool 103, in accordance with one embodiment of the present invention.

FIG. 4 illustrates components of a hard drive fastener of tool 103, in accordance with one embodiment of the present invention.

Clamp bar 202 can further be illustrated with dimensions in metric unit based on a front view (i.e., front 404) and rear view (i.e., rear 403). Clamp bar 202 contains a notched end (i.e., 401) that is coupled to clamp bar latch 201. A side profile 402 of the clamp bar with is shown.

Clamp bar latch 201 is a cylindrical shape structure with a protruding head that allows for notched end 401 of clamp bar 202 to be in the "locked" position. Clamp bar latch 201 can pivot from a "locked" (locked 422) to an "unlocked" position (unlocked 421), allowing clamp bar 202 to pivot away.

Clamp pivot 203, in conjunction with pin 410 allows for clamp bar 202 to rotate up (away) and down (back) to the front of tool 103.

Figure 5:
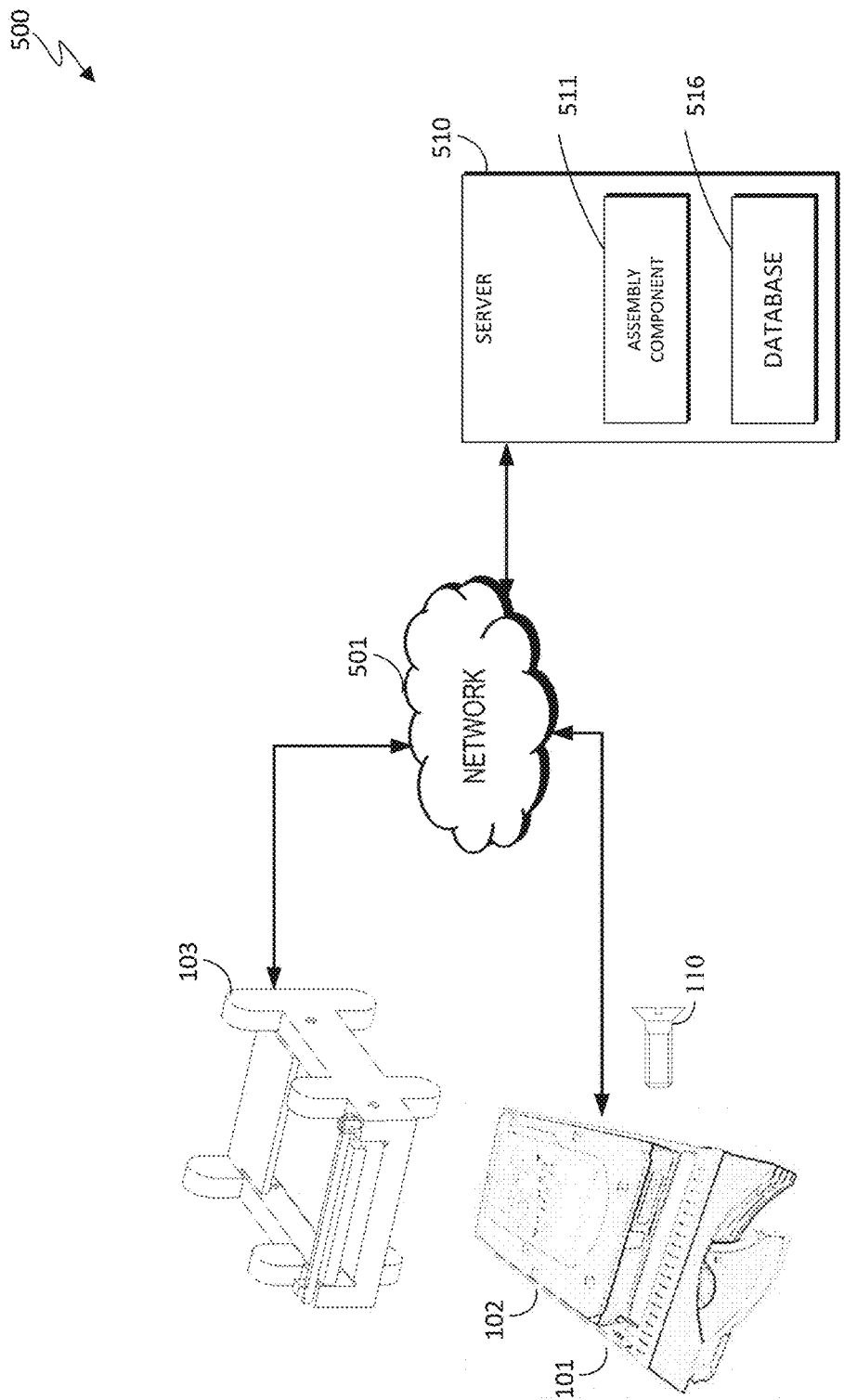
FIG. 5 is a functional block diagram illustrating a high level overview of the hard drive carrier environment, designated as 500, in accordance with an embodiment of the present invention.

FIG. 5 is a functional block diagram illustrating a high level overview of the hard drive carrier environment, designated as 500, in accordance with an embodiment of the present invention.

FIG. 5 provides only an illustration of one implementation and does not imply any limitations with regard to the environments in which different embodiments may be implemented. Many modifications to the depicted environment may be made by those skilled in the art without departing from the scope of the invention as recited by the claims.

Hard drive carrier environment 500 includes network 501, hard drive carrier 101, hard drive 102, tool 103, fastener 110 and server 510.

Network 501 can be, for example, a telecommunications network, a local area network (LAN), a wide area network (WAN), such as the Internet, or a combination of the three, and can include wired, wireless, or fiber optic connections. Network 501 can include one or more wired and/or wireless networks that are capable of receiving and transmitting data, voice, and/or video signals, including multimedia signals that include voice, data, and video information. In general, network 501 can be any combination of connections and protocols that can support communications between server 510, hard drive carrier 101, hard drive 102, tool 103 and other computing devices (not shown) within hard drive carrier environment 500. It is noted that other computing devices can include, but is not limited to, hard drive carrier 101, hard drive 102, tool 103 and any electromechanical devices capable of carrying out a series of computing instructions.

Server 510 can be a standalone computing device, a management server, a web server, a mobile computing device, or any other electronic device or computing system capable of receiving, sending, and processing data. In other embodiments, server 510 can represent a server computing system utilizing multiple computers as a server system, such as in a cloud computing environment. In another embodiment, server 510 can be a laptop computer, a tablet computer, a notebook computer, a personal computer (PC), a desktop computer, a personal digital assistant (PDA), a smart phone, or any other programmable electronic device capable of communicating other computing devices (not shown) within hard drive environment 500 via network 501. In another embodiment, server 510 represents a computing system utilizing clustered computers and components (e.g., database server computers, application server computers, etc.) that act as a single pool of seamless resources when accessed within hard drive carrier environment 500.

Embodiment of the present invention can reside on server 510. Server 510 includes assembly component 511 and database 516.

Assembly component 511 provides the capability of managing an electronic inventory of components during assembly (i.e., tracking of subcomponents before final assembly). For example, assembly component 511, through the use of electronic bar code scanner, can scan in barcode of subcomponents at assembly station and store the information in an inventory database/tracking system (e.g., database 516, etc.).

Database 516 is a repository for data used by assembly component 511. Database 516 can be implemented with any type of storage device capable of storing data and configuration files that can be accessed and utilized by server 510, such as a database server, a hard disk drive, or a flash memory. Database 516 uses one or more of a plurality of techniques known in the art to store a plurality of information. In the depicted embodiment, database 516 resides on server 510. In another embodiment, database 516 may reside elsewhere within hard drive carrier environment 500, provided that assembly component 511 has access to database 516. Database 516 may store information associated with, but is not limited to, knowledge corpus, i) part number, ii) serial number, iii) assembled date of components, iv) name of operator that assembled the component and v) tool used to assemble the components.

Figure 6:
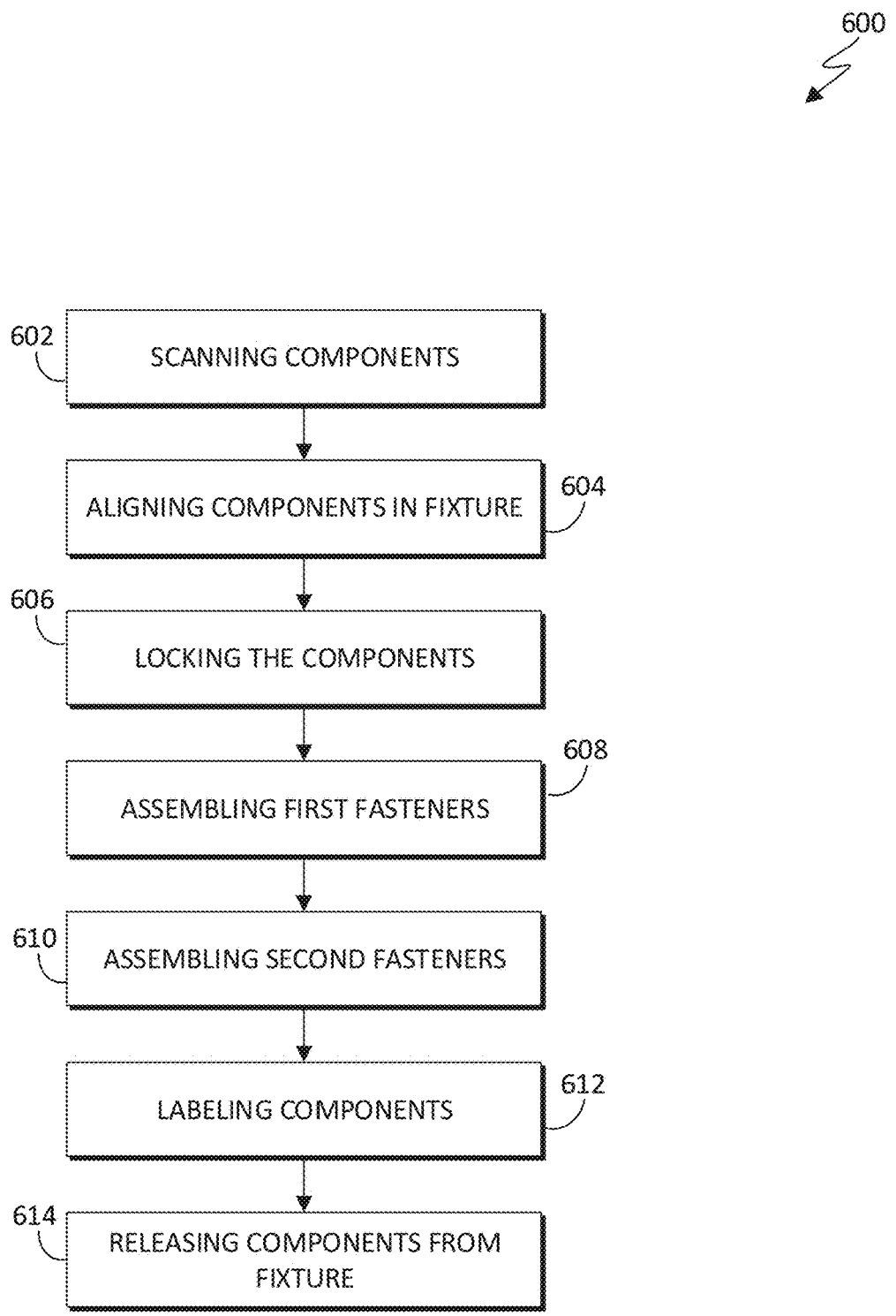
FIG. 6 is a high-level flowchart illustrating the operation of tool 103, designated as 600, in accordance with an embodiment of the present invention.

FIG. 6 is a high-level flowchart illustrating the operation of tool 103, designated as 600, in accordance with an embodiment of the present invention.

Assembly component 511 scans the components (step 602). In an embodiment, assembly component 511, scans the components to verify identity the components (e.g., hard drive and hard drive carrier). For example, assembly component 511, through the use of electronic bar code scanner, can scan in barcode of subcomponents (e.g., hard drive and hard drive carrier) at assembly station #4 and store the information in an inventory database/tracking system (e.g., database 516, etc.).

A user aligns components in the fixture (step 604). In an embodiment, a user inserts/slides subcomponents (e.g., hard drive and hard drive carrier) into the fixture (i.e., tool 103). For example, the user slides both the hard drive and hard drive carrier all the way to the end of tool 103. There is a mechanical backend plate 205 that prevents the components from sliding out of the fixture. It is noted that clamp bar 202 must be unlocked and pulled away from clamp bar latch 201 in order for the hard drive and hard drive carrier to slide into front of the fixture.

The user locks the components to the fixture (step 606). In an embodiment, the user moves a holding mechanism (i.e., clamp bar 202) from the unlocked position to the locked position. For example, the user moves clamp bar (i.e., 202) down to clamp bar latch 201. The user swivels clamp bar latch from the unlock position (see unlocked 421 of FIG. 4) to a lock position (see locked 422 of FIG. 4).

The user assembles the first fasteners (step 608). In an embodiment, the user applies a first set of fasteners 110 through the voids (i.e., holes 210) of first one of the side walls to secure the drive to the carrier to form a subassembly. For example, the user tighten the first set of screws through the holes 210, located on the left side (FIG. 2A).

The user assembles the second fasteners (step 610). In an embodiment, the user applies the second set of fasteners 110 through the voids (i.e., holes 210) of first one of the side walls to secure the drive to the carrier to form a subassembly. For example, the user tighten the second set of screws through holes 210, located on the left side (FIG. 2B).

The user labels the components (step 612). In an embodiment, the user affix labels a new part number on the assembled components. For example, the user put a pair of labels in the new sub-assembly (i.e., the assembled HDD and the carrier).

The user releases the components (step 614). In an embodiment, the user releases the subassembly (i.e., assembled components) from the fixture by unlocking releasable hold mechanism (i.e., clamp bar 202). For example, to release releasable hold mechanism (i.e., clamp bar 202), the user swivels clamp bar latch 201 (see unlocked 421 and locked 422 of FIG. 4) in the opposite direction of step 606. The user can take out the assembled components to be packaged for shipping (i.e., shipping container).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A fixture for holding a hard drive and a hard drive carrier in place prior to assembly, the fixture comprising:
   a base having a first surface and a second surface;
   a first end open of the base for receiving components;
   a set of walls rising from the base, a first wall rising from the base proximate a second end opposite the first end open and a pair of opposing side walls including voids rising from the first surface between the first end open and the second end, to form a slot there between to receive the components within and adjacent the first surface;
   a first set of a plurality of stands attached to the first wall near the first end open and the second end, rising away from the first surface;
   a second set of plurality of stands attached to the first wall near the first end open and the second end, rising away from the second surface;
   a third set of plurality of stands attached to the second wall near the first end open and the second end, rising away from the first surface;
   a fourth set of plurality of stands attached to the second wall near the first end open and the second end, rising away from the second surface; and
   a releasable hold mechanism proximate the first end open in a first position enabling the receiving of the components and in a second position providing a hold of the components.

2. The fixture of claim 1, wherein the fixtures is made from a material comprising aluminum and polyoxymethylene.

3. The fixture of claim 1, wherein the voids are holes for allowing screws to pass through.

4. The fixture of claim 1, wherein the releasable hold mechanism further comprises:
   an elongated bar connected to a pivot mechanism via a pin; and
   a notched end of the elongated bar coupled to a swivel mechanism, wherein the first position allows the elongated bar to be locked into the swivel mechanism and the second position allows the bar to be freed from the swivel mechanism.

5. The fixture of claim 1, wherein the first surface is the top surface of the base and the second surface is the top surface of the base.

6. The fixture of claim 1, wherein the components further comprises the hard drive and the hard drive carrier, wherein the hard drive comprises of a 2.5 inch hard drive or 3.5 inch hard drive and the hard drive carrier dimensioned to fit the 2.5 inch hard drive or the 3.5 inch hard drive.

7. A system for assembly of a hard drive to a hard drive carrier by using a fixture, the system comprising:
   the hard drive;
   the hard drive carrier;
   the fixture, wherein the fixture comprising:
   a base having a first surface and a second surface;
   a first end open of the base for receiving components;
   a set of walls rising from the base, a first wall rising from the base proximate a second end opposite the first end open and a pair of opposing side walls including voids rising from the first surface between the first end open and the second end, to form a slot there between to receive the components within and adjacent the first surface;
   a first set of plurality of stands attached to the first wall near the first end open and the second end, rising away from the first surface;
   a second set of plurality of stands attached to the first wall near the first end open and the second end, rising away from the second surface;
   a third set of plurality of stands attached to the second wall near the first end open and the second end, rising away from the first surface;
   a fourth set of plurality of stands attached to the second wall near the first end a open end the second end, rising away from the second surface; and a releasable hold mechanism proximate the first end open in a first position enabling the receiving of the components and in a second position providing a hold of the components;

one or more fasteners; and a fastening tool to apply the one or more fasteners between the hard drive carrier to the hard drive through the voids, while the hard drive and the hard drive carrier is being held in place by the fixture.

8. The system of claim 7, wherein the one or more fasteners further comprises of screws.

9. The system of claim 7, wherein the fastening tool allows for fastening of screws.

10. The system of claim 7, wherein the fixtures is made from material comprising aluminum and polyoxymethylene.

11. The system of claim 7, wherein the voids are holes for allowing only a non-head end of a screw to pass through.

12. The system of claim 7, wherein the releasable hold mechanism further comprises:

an elongated bar connected to a pivot mechanism via a pin;

a notched end of the elongated bar coupled to a swivel mechanism, wherein the first position allows the elongated bar to be locked into the swivel mechanism and the second position allows the bar to be freed from the swivel mechanism.

* * * * *